(12) United States Patent
Tsai et al.

(10) Patent No.: US 6,649,513 B1
(45) Date of Patent: Nov. 18, 2003

(54) COPPER BACK-END-OF-LINE BY ELECTROPOLISH

(75) Inventors: Ming-Hsing Tsai, Taipei (TW); Shih-Wei Chou, Taipei (TW); Winston Shue, Hsinchu (TW); Mong-Song Liang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/146,286

(22) Filed: May 15, 2002

(51) Int. Cl.⁷ .................. H01L 21/4763; H05K 3/07
(52) U.S. Cl. .................. 438/626; 438/622; 438/625; 438/629; 438/631; 438/687; 438/697; 205/640
(58) Field of Search ................. 438/626, 625, 438/624, 623, 622, 627, 629, 631, 633, 637–640, 666, 667, 671, 687, 688, 697, 699; 205/640, 668–670

(56) References Cited

U.S. PATENT DOCUMENTS

| | | | |
|---|---|---|---|
| 5,567,300 A | 10/1996 | Datta et al. | 205/652 |
| 6,017,820 A | 1/2000 | Ting et al. | 438/689 |
| 6,066,892 A * | 5/2000 | Ding et al. | 257/751 |
| 6,121,152 A | 9/2000 | Adams et al. | 438/697 |
| 6,171,960 B1 | 1/2001 | Lee | 438/687 |
| 6,207,222 B1 | 3/2001 | Chen et al. | 427/97 |
| 6,221,758 B1 * | 4/2001 | Liu et al. | 438/626 |
| 6,395,152 B1 * | 5/2002 | Wang | 204/224 M |

* cited by examiner

Primary Examiner—Carl Whitehead, Jr.
Assistant Examiner—Thanhha Pham
(74) Attorney, Agent, or Firm—George O. Saile; Stephen B. Ackerman; Stephen G. Stanton

(57) ABSTRACT

A method of fabricating a planarized metal structure comprising the following steps. A structure is provided. A patterned dielectric layer is formed over the structure. The patterned dielectric layer having an opening formed therein and exposing at least a portion of the structure. A first-metal layer is formed over the patterned dielectric layer filling the opening. The first-metal layer including at least a doped metal portion adjacent the patterned dielectric layer. The doped metal portion being doped with a second-metal. The structure is annealed to form a second-metal oxide layer adjacent the patterned dielectric layer. The first-metal layer and the second-metal oxide layer are planarized using only a electropolishing process to remove the excess of the first-metal layer and the second-metal oxide layer from over the patterned dielectric layer and leaving a planarized metal structure within the opening.

30 Claims, 2 Drawing Sheets

COPPER BACK-END-OF-LINE BY ELECTROPOLISH

FIELD OF THE INVENTION

The present invention relates generally to semiconductor fabrication and more specifically to methods of non-mechanical planarization of copper structures.

BACKGROUND OF THE INVENTION

Copper (Cu) damascene processing requires chemical mechanical polishing (CMP) to polish/remove copper on the field area and polish/planarize the copper in the trench, for example, to form a planarized interconnect. However the CMP process creates problem issues such as peeling, dishing and erosion for example.

An electropolish technique may be used to remove/planarize the copper without using mechanical force. However, the copper barrier layer must still be removed using chemical mechanical polishing or etching using a dry or wet etch process which introduces the above problem issues.

U.S. Pat. No. 6,121,152 to Adams et al. describes a copper electropolish planarization process.

U.S. Pat. No. 6,017,820 to Ting et al. describes a copper electropolishing tool.

U.S. Pat. No. 5,567,300 to Datta et al., U.S. Pat. No. 6,207,222 B1 to Chen et al. and U.S. Pat. No. 6,171,960 B1 to Lee describe related doped copper processes.

SUMMARY OF THE INVENTION

Accordingly, it is an object of one or more embodiments of the present invention to provide an improved method of forming non-mechanical planarized copper structures.

Other objects will appear hereinafter.

It has now been discovered that the above and other objects of the present invention may be accomplished in the following manner. Specifically, a structure is provided. A patterned dielectric layer is formed over the structure. The patterned dielectric layer having an opening formed therein and exposing at least a portion of the structure. A first-metal layer is formed over the patterned dielectric layer filling the opening. The first-metal layer including at least a doped metal portion adjacent the patterned dielectric layer. The doped metal portion being doped with a second-metal. The structure is annealed to form a second-metal oxide layer adjacent the patterned dielectric layer. The first-metal layer and the second-metal oxide layer are planarized using only a electropolishing process to remove the excess of the first-metal layer and the second-metal oxide layer from over the patterned dielectric layer and leaving a planarized metal structure within the opening.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
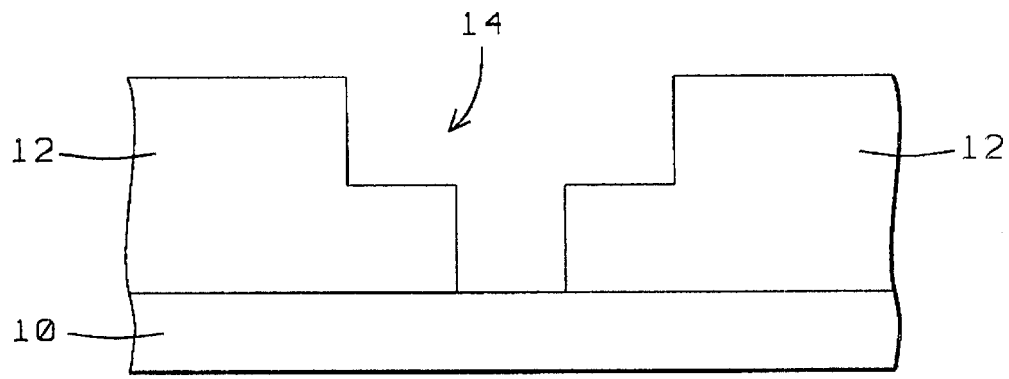
FIGS. 1 to 5 schematically illustrate a preferred embodiment of the present invention.

As shown in FIG. 1, structure 10 has a dielectric layer 12 formed thereover. Structure 10 is preferably a silicon substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Dielectric layer 12 includes an opening 14 formed therein. Opening 14 may be, for example, a trench opening, a via opening or a dual damascene opening as is shown in the figures that exposes a portion of structure 10. Structure 10 may further include a conductive structure (not shown) that is at least partially exposed by opening 14.

The present invention forms planarized metal structures within dielectric layers. The metal structures are preferably comprised of copper, aluminum or gold and are more preferably comprised of copper as will be used for ease of illustration hereafter.

First Embodiment (FIG. 2): Formation of Copper Seed Layer 16/Undoped Copper Layer 18

Figure 2:
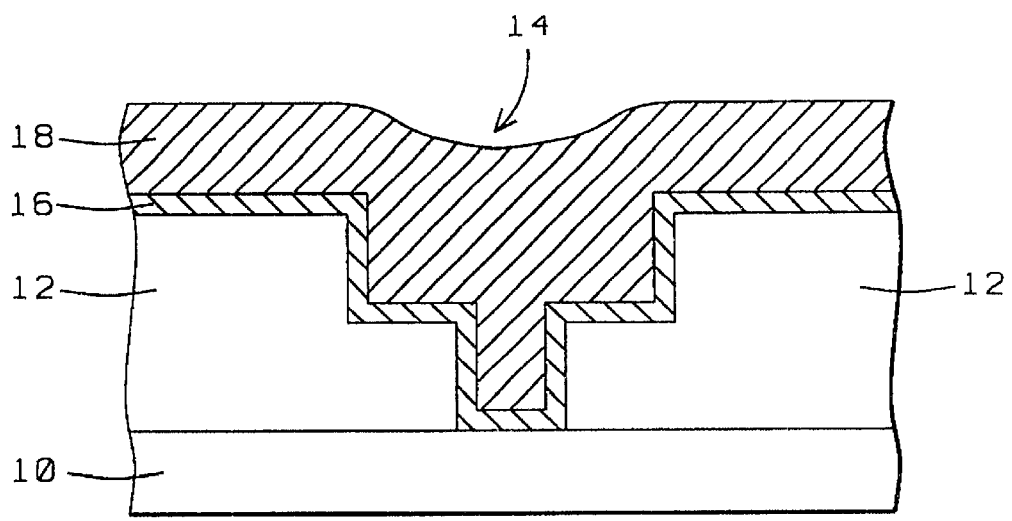

In a first embodiment and as shown in FIG. 2, a copper seed layer 16 is formed over patterned dielectric layer 12 and lining opening 14.

Then an undoped copper layer 18 is formed over copper seed layer 16, filling copper seed layer 16 lined opening 14. Undoped copper 18 is formed to a thickness of preferably from about 1000 to 3000 Å.

Copper seed layer 16 is formed preferably using a physical vapor deposition (PVD) process and undoped copper 18 is formed over the copper seed barrier layer 16 preferably by plating.

If dielectric layer 12 is comprised of a dielectric material not requiring a metal barrier layer, then copper seed layer 16 may be comprised of undoped copper. Otherwise, copper seed layer 16 is comprised of doped copper.

Second Embodiment (FIG. 3): Formation of Doped Copper Layer 20

Figure 3:
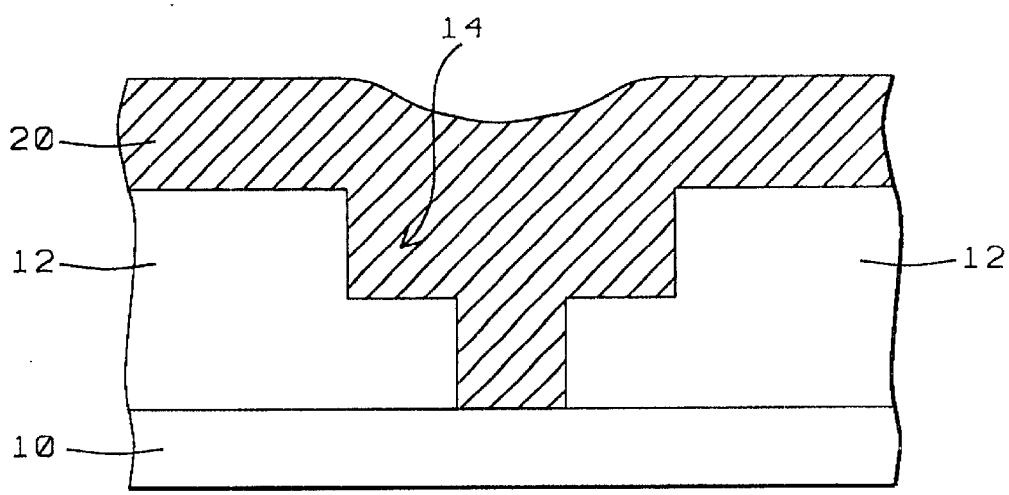

In a second embodiment and as shown in FIG. 3, a doped copper layer 20 is formed over patterned dielectric layer 12 and filling opening 14. Doped copper layer 20 is formed to a thickness of preferably from about 1000 to 3000 Å.

Doped copper layer 20/doped copper seed layer 16 is preferably doped with another metal such as Mg, Sn, Ti or Zr to a concentration of preferably from about 0.08 to 2.02% and more preferably from about 0.1 to 2.0%.

For ease of illustration, the structure of the second embodiment will be used for further processing in accordance with the present invention with comments discussing the effects of the further processing as the structure of the first embodiment.

Anneal 22

Figure 4:
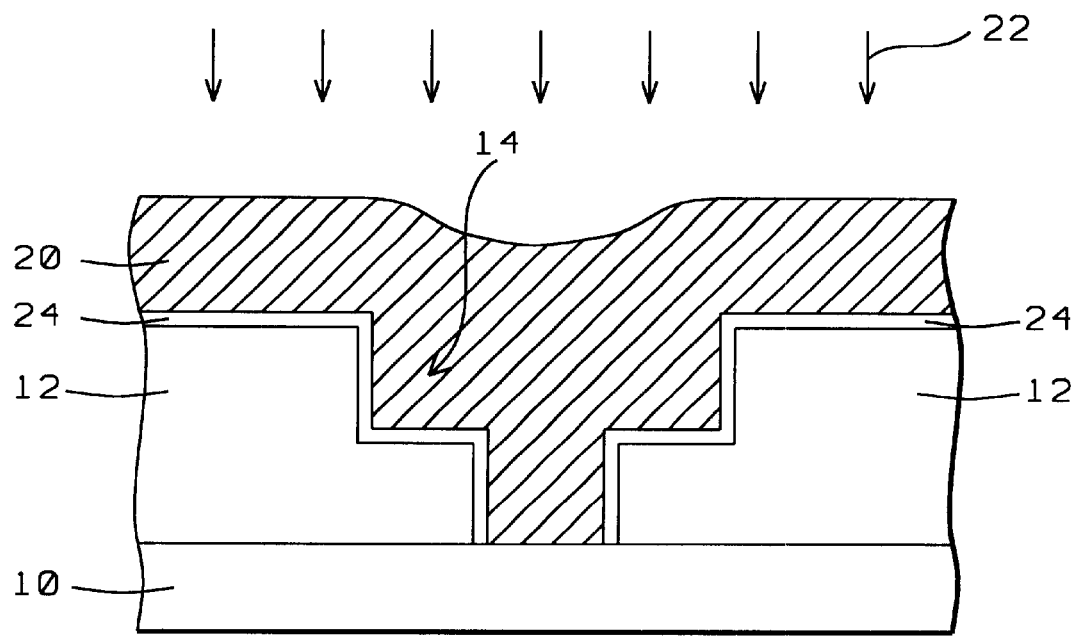

As shown in FIG. 4, the structure is subjected to an annealing process 22 conducted at a temperature of preferably from about 180 to 420° C. and more preferably from about 200 to 400° C. Anneal 22 serves two purposes: (1) the doping element within doped copper 20 (doped copper seed layer 16) is redistributed so as to accumulate at the interface between doped copper layer 20 (doped copper seed layer 16) and patterned dielectric layer 12; and (2) oxidizes the metal doping element to form a thin dope-metal oxide layer 24 adjacent patterned dielectric layer 12 that serves as a barrier layer for the balance of the doped copper layer 16 (undoped copper layer 18).

Electropolish

Figure 5:
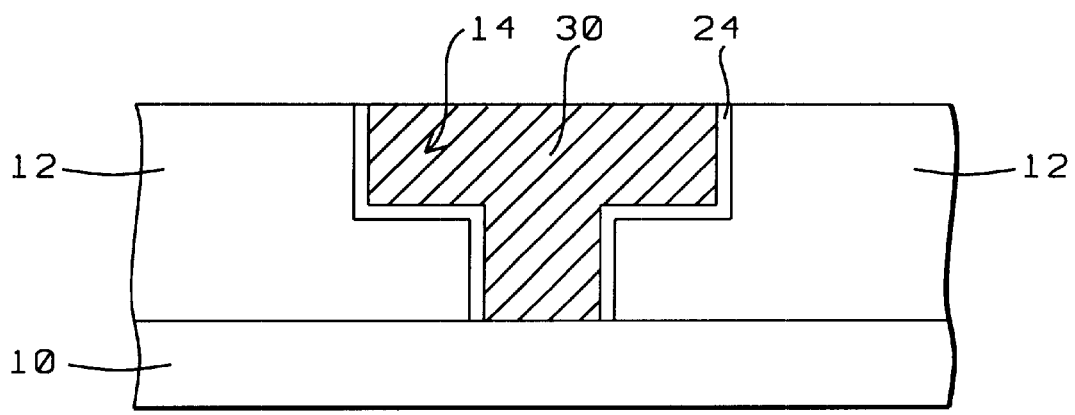

As shown in FIG. 5, the structure is subjected to an electropolishing process to remove (1) the excess annealed doped copper 20'/dope-metal oxide layer (barrier layer) 24 from over patterned dielectric layer 12 of the second embodiment; or (2) the excess annealed copper 18/copper seed layer 16/dope-metal oxide layer (barrier layer) 24 from over the patterned dielectric layer 12 of the first embodiment to form: a planarized copper structure 30 within opening 14 having a thin dope-metal oxide layer 24 within opening 14 adjacent patterned dielectric layer 12.

It is noted that the electropolishing process removes the excess dope-metal oxide layer (barrier layer) 24 from over the patterned dielectric layer 12 so that a mechanical polishing process is not needed to do so. This eliminates the problem issues associated with mechanical polishing processes as noted above, such a peeling, dishing and erosion.

While particular embodiments of the present invention have been illustrated and described, it is not intended to limit the invention, except as defined by the following claims.

We claim:

1. A method of fabricating a planarized metal structure, comprising the steps of:
   providing a structure;
   forming a patterned dielectric layer over the structure, the patterned dielectric layer having an opening formed therein exposing at least a portion of the structure;
   forming a first-metal layer over the patterned dielectric layer filling the opening, first-metal layer including at least a doped metal portion adjacent the patterned dielectric layer, the doped metal portion being doped with a second-metal;
   annealing the structure to form a second-metal oxide layer adjacent the patterned dielectric layer; and
   planarizing the first-metal layer and the second-metal oxide layer using only a electropolishing process to remove the excess of the first-metal layer and the second-metal oxide layer from over the patterned dielectric layer and leaving a planarized metal structure within the opening.

2. The method of claim 1, wherein the structure is a silicon substrate.

3. The method of claim 1, wherein the opening is an opening selected from the group consisting of a trench opening, a via opening and a dual damascene opening.

4. The method of claim 1, wherein the first-metal layer is comprised of a metal selected from the group consisting of copper, aluminum and gold; and the second-metal is a metal selected from the group consisting of Mg, Sn, Ti and Zr.

5. The method of claim 1, wherein the first-metal layer is comprised of copper and the second-metal is a metal selected from the group consisting of Mg, Sn, Ti and Zr.

6. The method of claim 1, wherein the anneal is conducted at a temperature of from about 180 to 420° C.

7. The method of claim 1, wherein the anneal is conducted at a temperature of from about 200 to 400° C.

8. The method of claim 1, wherein the first-metal layer is a doped metal layer.

9. The method of claim 1, wherein the first-metal layer is a doped metal layer comprised of a metal selected from the group consisting of copper, aluminum and gold doped with the second-metal selected from the group consisting of Mg, Sn, Ti and Zr.

10. The method of claim 1, wherein the first-metal layer is a doped metal layer comprised of copper doped with the second-metal selected from the group consisting of Mg, Sn, Ti and Zr.

11. The method of claim 1, wherein the first-metal layer is comprised of an upper layer and a lower layer; the lower layer being the doped metal portion adjacent the patterned dielectric layer; and the upper layer comprising an undoped metal.

12. The method of claim 1, wherein the first-metal layer is comprised of an upper layer and a lower layer; the lower layer being the doped metal portion comprised of a metal selected from the group consisting of copper, aluminum and gold doped with the second-metal selected from the group consisting of Mg, Sn, Ti and Zr; and the upper layer comprising an undoped metal selected from the group consisting of copper, aluminum and gold.

13. The method of claim 1, wherein the first-metal layer is comprised of an upper layer and a lower layer; the lower layer being the doped metal portion comprised of copper doped with the second-metal selected from the group consisting of Mg, Sn, Ti and Zr; and the upper layer comprising undoped copper.

14. A method of fabricating a planarized metal structure, comprising the steps of:
   providing a silicon substrate;
   forming a patterned dielectric layer over the silicon substrate, the patterned dielectric layer having an opening formed therein exposing at least a portion of the silicon substrate;
   forming a doped first-metal seed layer over the patterned dielectric layer to line the opening; the doped first metal seed layer being doped with a second-metal;
   forming a third-metal fill layer over the doped first-metal seed layer filling the lined opening;
   annealing the structure to form a second-metal oxide layer adjacent the patterned dielectric layer; and
   planarizing the doped first-metal seed layer, the third-metal fill layer and the second-metal oxide layer using only a electropolishing process to remove the excess of the doped first-metal seed layer, the third-metal fill layer and the second-metal oxide layer from over the patterned dielectric layer and leaving a planarized metal structure within the opening.

15. The method of claim 14, wherein the opening is an opening selected from the group consisting of a trench opening, a via opening and a dual damascene opening.

16. The method of claim 14, wherein the doped first-metal seed layer is comprised of a metal selected from the group consisting of copper, aluminum and gold doped with the second-metal that is selected from the group consisting of Mg, Sn, Ti and Zr; and the third-metal fill layer is comprised of a metal selected from the group consisting of copper, aluminum and gold.

17. The method of claim 14, wherein the doped first-metal seed layer is a copper layer doped with the second-metal that is selected from the group consisting of Mg, Sn, Ti and Zr; and the third-metal fill layer is a copper layer.

18. The method of claim 14, wherein the third-metal fill layer 18 has a thickness of from about 1000 to 3000 Å.

19. The method of claim 14, wherein the doped first-metal seed layer is formed using a PVD process and the third-metal fill layer is formed using a plating process.

20. The method of claim 14, wherein the anneal 22 is conducted at a temperature of from about 180 to 420° C.

21. The method of claim 14, wherein the anneal is conducted at a temperature of from about 200 to 400° C.

22. A method of fabricating a planarized metal structure, comprising the steps of:

providing a silicon substrate;

forming a patterned dielectric layer over the silicon substrate, the patterned dielectric layer having an opening formed therein exposing at least a portion of the silicon substrate;

forming a doped first-metal layer over the patterned dielectric layer filling the opening, the doped first-metal layer being doped with a second-metal;

annealing the structure to form a second-metal oxide layer adjacent the patterned dielectric layer; and planarizing the doped first-metal layer and the second-metal oxide layer using only a electropolishing process to remove the excess of the doped first-metal layer and the second-metal oxide layer from over the patterned dielectric layer and leaving a planarized metal structure within the opening.

23. The method of claim 22, wherein the opening is an opening selected from the group consisting of a trench opening, a via opening and a dual damascene opening.

24. The method of claim 22, wherein the doped first-metal layer is comprised of a metal selected from the group consisting of copper, aluminum and gold doped with the second-metal that is a metal selected from the group consisting of Mg, Sn, Ti and Zr.

25. The method of claim 22, wherein the doped first-metal layer is comprised of copper doped with the second-metal that is a metal selected from the group consisting of Mg, Sn, Ti and Zr.

26. The method of claim 22, wherein the anneal is conducted at a temperature of from about 180 to 420° C.

27. The method of claim 22, wherein the anneal is conducted at a temperature of from about 200 to 400° C.

28. The method of claim 22, wherein the doped first-metal layer is formed to a thickness of from about 1000 to 3000 Å.

29. The method of claim 22, wherein the opening is an opening selected from the group consisting of a trench opening, a via opening and a dual damascene opening; the doped first-metal layer is comprised of a metal selected from the group consisting of copper, aluminum and gold doped with the second-metal that is a metal selected from the group consisting of Mg, Sn, Ti and Zr.

30. The method of claim 22, wherein the opening is an opening selected from the group consisting of a trench opening, a via opening and a dual damascene opening; the doped first-metal layer is comprised of copper doped with the second-metal that is a metal selected from the group consisting of Mg, Sn, Ti and Zr.

* * * * *